United States Patent
Chen

(10) Patent No.: US 7,983,059 B2
(45) Date of Patent: Jul. 19, 2011

(54) HIGH FREQUENCY POWER CONVERTER BASED ON TRANSFORMERS

(75) Inventor: Baoxing Chen, Westford, MA (US)

(73) Assignee: Analog Devices, Inc., Norwood, MA (US)

(*) Notice: Subject to any disclaimer, the term of this patent is extended or adjusted under 35 U.S.C. 154(b) by 450 days.

(21) Appl. No.: 12/202,627

(22) Filed: Sep. 2, 2008

(65) Prior Publication Data

US 2010/0052630 A1  Mar. 4, 2010

(51) Int. Cl.
H02M 3/335 (2006.01)

(52) U.S. Cl. .................. 363/21.11; 363/98; 336/192

(58) Field of Classification Search ............. 363/16–17, 363/21.02, 21.06, 21.11, 21.12, 97, 98; 307/295.2, 307/296.4, 296.8; 327/114, 172, 531, 534, 327/545; 361/35, 38, 58, 115
See application file for complete search history.

(56) References Cited

U.S. PATENT DOCUMENTS

| | | | |
|---|---|---|---|
| 4,024,452 A | 5/1977 | Seidel | |
| 4,677,534 A * | 6/1987 | Okochi | 363/21.11 |
| 4,731,720 A * | 3/1988 | Takahashi | 363/21.09 |
| 4,785,345 A | 11/1988 | Rawls et al. | |
| 5,469,098 A | 11/1995 | Johnson, Jr. | |
| 5,498,995 A * | 3/1996 | Szepesi et al. | 327/538 |
| 5,650,357 A | 7/1997 | Dobkin et al. | |
| 5,701,037 A | 12/1997 | Weber et al. | |
| 5,781,077 A | 7/1998 | Leitch et al. | |
| 5,903,183 A * | 5/1999 | Inukai | 327/540 |
| 6,992,871 B2 * | 1/2006 | Ahn et al. | 361/35 |
| 7,298,238 B1 | 11/2007 | Eaton et al. | |
| 7,456,722 B1 * | 11/2008 | Eaton et al. | 336/200 |
| 7,558,083 B2 * | 7/2009 | Schlecht | 363/21.06 |
| 2004/0070481 A1 | 4/2004 | Patel et al. | |
| 2006/0120115 A1 | 6/2006 | Chen et al. | |
| 2010/0046252 A1 * | 2/2010 | Keller | 363/21.07 |

FOREIGN PATENT DOCUMENTS

| | | |
|---|---|---|
| WO | WO97/14170 | 4/1997 |
| WO | WO 99/21332 | 4/1999 |
| WO | WO2008/040179 | 4/2008 |
| WO | WO 2008/114073 | 9/2008 |

OTHER PUBLICATIONS

Partial International Search Report dated Jan. 21, 2010, in counterpart international application No. PCT/US2009/055483.
International Search Report dated Jul. 30, 2010, in counterpart international application No. PCT/US2009/055483.
G. Knoedl, Jr., et al., "A Monolithic Signal Isolator", IEEE, 1989, pp. 165-170.

* cited by examiner

Primary Examiner — Rajnikant B Patel
(74) Attorney, Agent, or Firm — Kenyon & Kenyon LLP

(57) ABSTRACT

A transformer-based power conversion system includes a primary coil is provided in a current path that includes a single energy switch. An oscillator is coupled to a control input of the energy switch. The design conserves switch-based losses as compared to prior designs because a single switch is provided in a current path occupied by the primary coil. The design also provides improved conversion efficiency because parasitic capacitances associated with the energy switch cooperate with charge transfers generated by the oscillator.

27 Claims, 4 Drawing Sheets

100

200

300

400

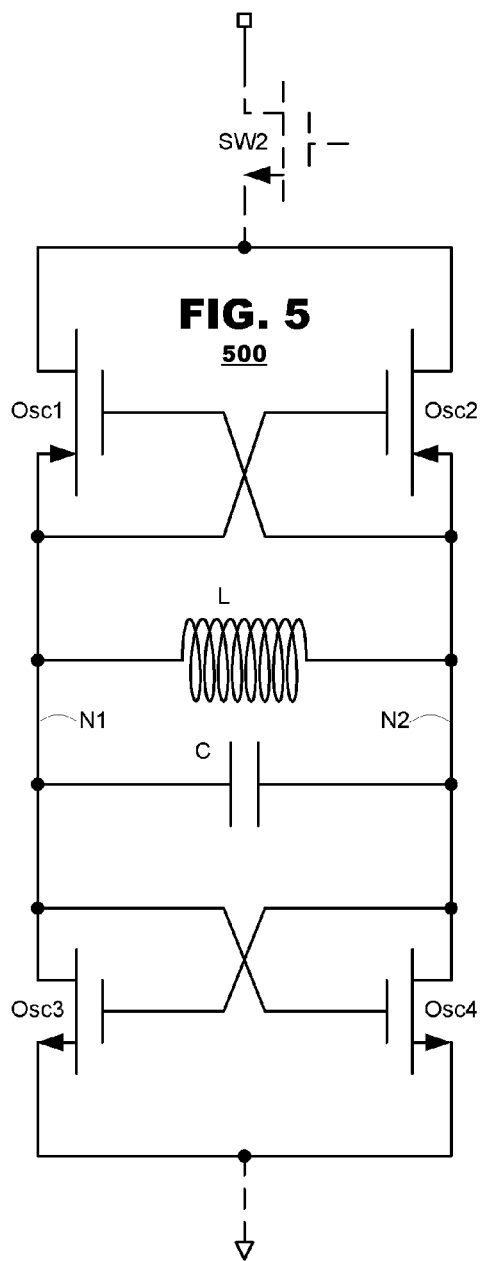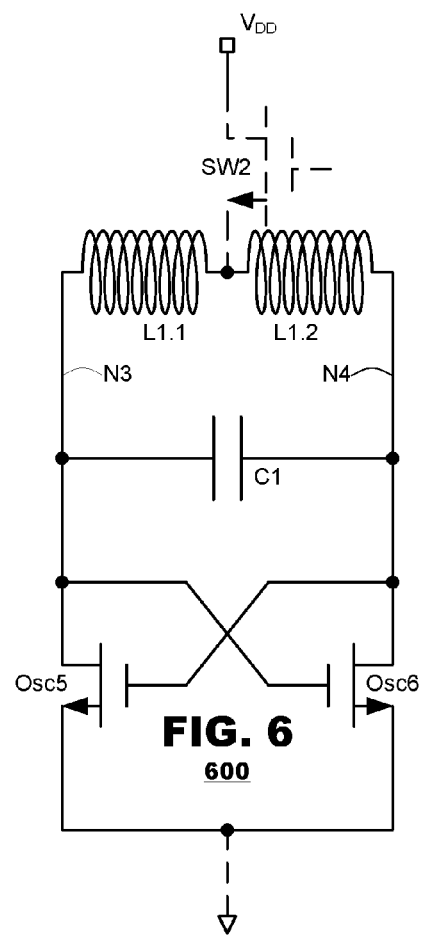

US 7,983,059 B2

HIGH FREQUENCY POWER CONVERTER BASED ON TRANSFORMERS

BACKGROUND

The present invention relates to electrical isolators in which microtransformers provide power transfer from a first isolator loop to a second isolator loop.

The use of microtransformers for power transfer is disclosed, for example in US Patent Application Publication 2006/0120115 A1 by the present inventor, the disclosure of which is incorporated herein by reference. Such power conversion systems include a power transformer that causes power transfer between a powered primary circuit loop and an otherwise unpowered secondary circuit loop. The power transformer is a member of a switch controlled, oscillating tank circuit that ideally operates at high frequency to maintain efficiency. In the known designs, at least two cross-coupled switches are needed to maintain a sustainable oscillation. The tank switching frequency is limited by the size of the switches and the inductance for the windings of the power transformers. The parasitic capacitance increases as the switch size increases and can limit the tank switching frequency.

A feedback path is provided between the circuit loops to regulate operation of the primary circuit loop to ensure that the power delivered to the secondary circuit loop remains within predetermined norms. The feedback path includes a feedback switch, which is included in a current path from a supply voltage ($V_{DD}$) to the tank. This feedback switch causes undesirable power dissipation in the circuit. Moreover, the feedback path typically operates at a frequency much lower than the desired switching frequency of the tank circuit.

Power conversion efficiency and power conservation are important considerations for power converter systems. Accordingly, the inventors identified a need in the art for a microtransformer-based power conversion system that increases tank switching frequency over known systems and reduces switch-based losses.

BRIEF DESCRIPTION OF THE DRAWINGS

FIG. 5 is a circuit diagram of an oscillator according to an embodiment of the present invention.

FIG. 6 is a circuit diagram of an oscillator according to an embodiment of the present invention.

DETAILED DESCRIPTION

Embodiments of the present invention provide a transformer-based power conversion system that in which a primary coil is provided in a current path that includes a single energy switch. An oscillator is coupled to a control input of the energy switch. The design conserves switch-based losses as compared to prior designs because a single switch is provided in a current path occupied by the primary coil. The design also provides improved conversion efficiency because parasitic capacitances associated with the energy switch cooperate with charge transfers generated by the oscillator. Moreover, feedback switches can be removed from a current path occupied by the tank circuit, which contributes to higher switching frequencies therein.

Figure 1:
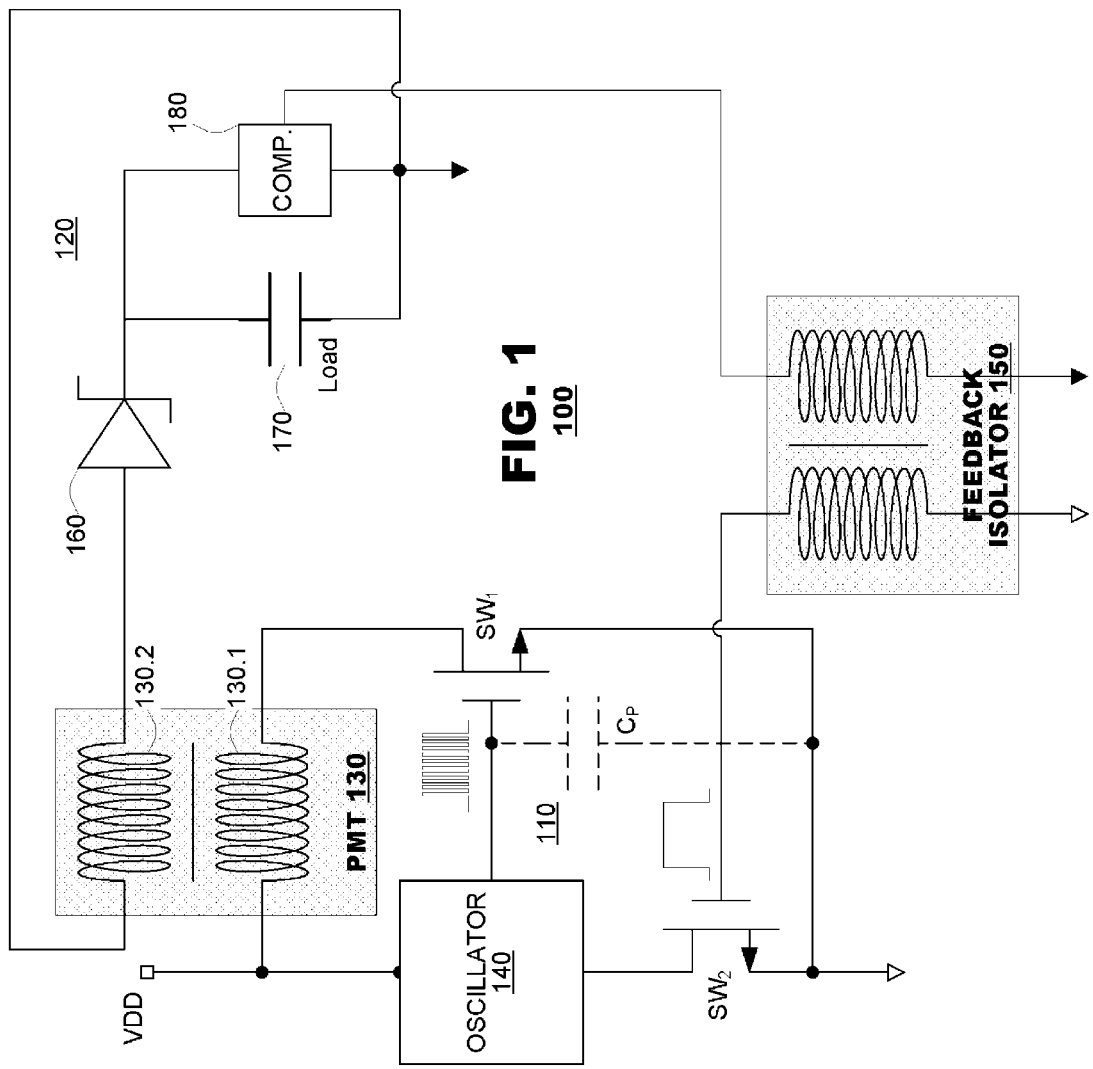
FIG. 1 is a circuit diagram of a power conversion system according to a first embodiment of the present invention.

FIG. 1 illustrates a power converter 100 according to an embodiment of the present invention. The power converter 100 may include first and second circuit loops 110, 120 coupled together by a microtransformer 130. The microtransformer 130 provides electrical isolation between the circuit loops 110, 120 but permits the first circuit loop 110 to generate power for the second circuit loop 120 as discussed herein. Thus, the circuit loops 110, 120 may be galvanically isolated from each other, having electrically isolated ground references.

According to the first embodiment a source voltage VDD may power the first circuit loop 110. A first terminal of a primary coil 130.1 of the microtransformer may be coupled to the source voltage VDD. A second terminal of the primary coil 130.1 may be coupled to a transistor switch SW1 (called the "energy switch" herein) at its source. A source of the energy switch SW1 may be coupled to ground.

Similarly, an oscillator 140 may be coupled to the source voltage VDD. An output of the oscillator 140 may be coupled to a gate of energy switch SW1. The oscillator 140 also may be coupled to a source of a second switch SW2, called the "feedback switch." A source of the feedback switch SW2 may be coupled to ground. A gate of the feedback switch SW2 may be coupled to a feedback isolator transformer 150, which passes control signals from the second circuit loop 120 to the first circuit loop 110. In response to the control signals, the feedback switch SW2 selectively activates or deactivates the oscillator 140.

The second circuit loop 120 may include a secondary coil of the microtransformer 130.2, a diode 160, a load circuit 170 and a comparator 180. The microtransformer 130 may induce currents in the second circuit loop 120 which may be delivered to the load 170 through the diode 160. The currents develop a potential across the load circuit 170. The comparator 180 may test the potential across the load 170 and develop feedback control signals if the potential exceeds or falls below operational requirements. The comparator 180 may be coupled to the feedback isolator transformer 150 to deliver the control signals back to the first circuit loop 110.

During operation, the feedback switch SW2 controls the oscillator 140 between an active state and an inactive state. In the active state, the oscillator 140 generates an oscillating driving signal to the gate of the energy switch SW1, which causes the energy switch SW1 to switch the primary coil 130.1 of the microtransformer 130 on and off at the frequency of the driving signal. The frequency of oscillation typically is much higher than the frequency of the feedback signal, which permits the microtransformer 130 to be switched at high frequency for power delivery to the second circuit loop 120 but permit a relatively slow feedback control signal to be returned to the first circuit loop 110 from the second circuit loop 120.

In practice, because the energy switch SW1 is a power switch that controls the microtransformer 130, the energy switch is made relatively large (for example, over 10,000 microns in width) as compared to other transistor switches (for example, the feedback switch SW2). The energy switch SW1, therefore, may possess a relatively large gate capacitance, which is modeled as capacitor Cp. Typically, switches with large parasitic capacitance would cause large power dissipation when they are switched a high frequencies. The embodiment of FIG. 1, however, couples the gate of the energy switch SW1 to an oscillator 140, which advantageously uses the parasitic capacitance of the energy switch SW1 during operation. When activated, the oscillator 140 operates at a resonant frequency which drives charge to the switch gate and receives return charge from the switch gate at the resonant frequency. The parasitic capacitance of the energy switch SW1 acts as a true capacitor and accumulates charge during a first phase of oscillation, when the oscillator drives charge to the gate, but returns the charge to the oscillator in the next phase of oscillation, when the oscillator receives charge. Power dissipation by the parasitic capacitance of the energy switch SW1, therefore, is minimized.

As another advantage, the design of FIG. 1 removes a feedback switch SW2 from a current path occupied by the primary coil 130.1 and the energy switch SW1. This design minimizes the number of switches in this current path and, as a consequence, reduces switch-based losses in the path. Further, the switching frequencies applied to the primary coil 130.1 are no longer limited by switching frequencies of the feedback switch SW2.

As a further advantage, the design of FIG. 1 permits optimized transformer switching frequency because the transformer switching frequency no longer depends on the inductance of the windings for the power transformer 130. Although the oscillator frequency may depend on the energy switch sizes, it is less likely to be impacted by it.

In FIG. 1 and throughout the present discussion, the load circuit 170 is shown as a capacitor in FIG. 1 for ease of illustration. Of course, it is not so limited. Circuit designers may introduce other components to act as a load 170 in accordance with the implementation needs for which they may use the power converter 100. For example, the load 170 may be a multi-component circuit which may include a capacitor for filtering and other components as desired. The voltage established across the load can be expected to be a DC voltage and, therefore, the capacitor will not draw any current.

In the foregoing description, although the feedback switch SW2 is shown as coupled between the oscillator 140 and ground, it also may be provided between the oscillator and VDD. Placement of the SW2 is immaterial to the design of FIG. 1 so long as it is provided somewhere along the VDD-to-ground path occupied by the oscillator and the energy switch SW1 is maintained off when the feedback switch SW2 is open or the oscillator 140 is otherwise de-activated.

Figure 2:
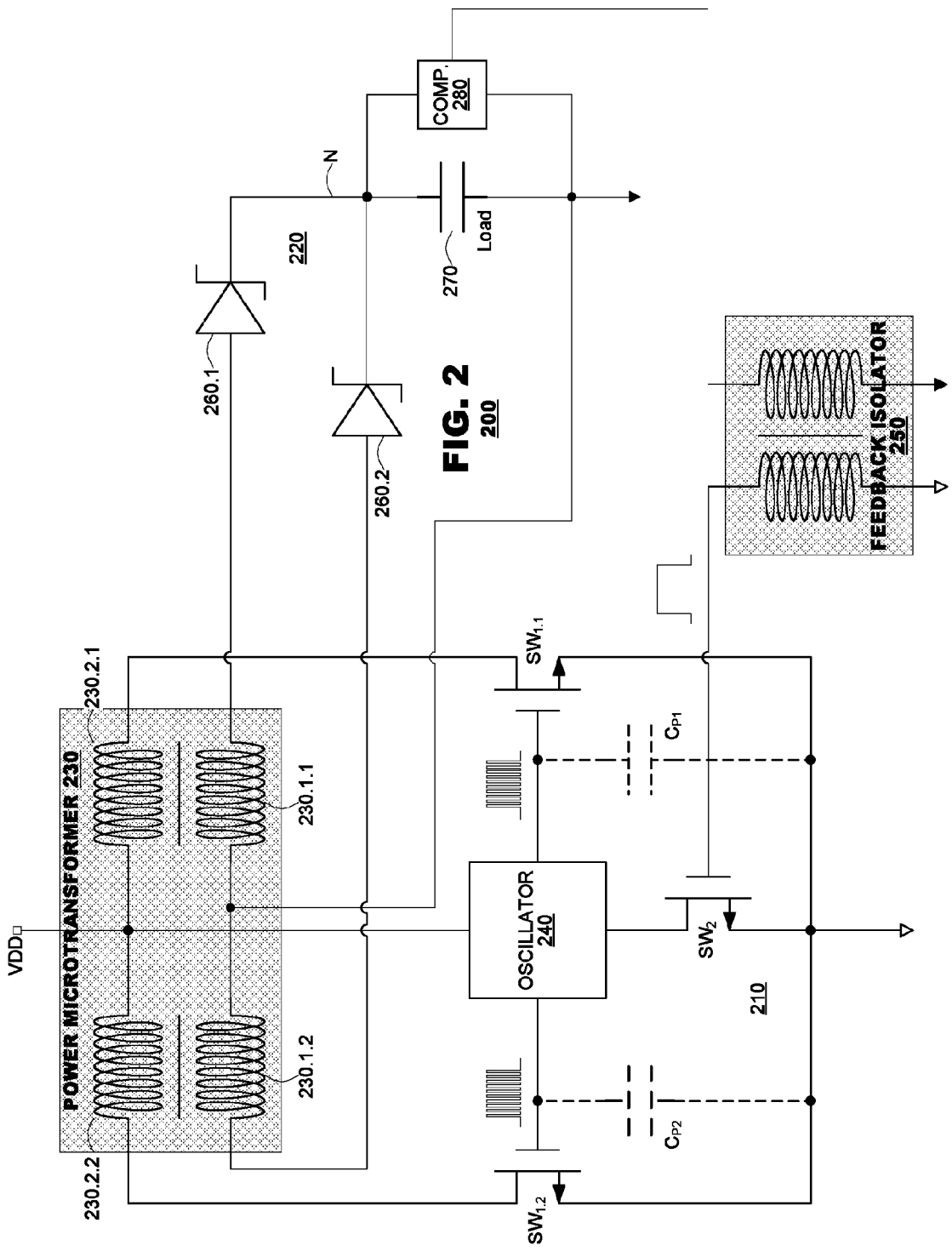
FIG. 2 is a circuit diagram of a power conversion system according to another embodiment of the present invention.

FIG. 2 illustrates a power converter 200 according to another embodiment of the present invention. The power converter 200 of FIG. 2 find application in systems that use differential voltages. The power converter 200 also may include first and second circuit loops 210, 220 coupled together by a microtransformer 230. Primary and secondary coils 230.1, 230.2 of the microtransformer each include a pair of windings (labeled a and b in FIG. 2) with respective center taps, which are connected to the respective circuit loops 210, 220 as discussed below. The microtransformer 230 provides electrical isolation between the circuit loops 210, 220 but permits the first circuit loop 210 to generate power for the second circuit loop 220 as discussed herein.

According to the first embodiment a source voltage VDD may power the first circuit loop 210. A center tap of a primary coil 230.1 of the microtransformer may be coupled to the source voltage VDD. A second terminal of the first primary coil 230.1.1 may be coupled to a first energy switch SW1.1 at its source. Similarly, a second terminal of the second primary coil 230.2.2 may be coupled to a second energy switch SW1.2 at its source. Drains of both energy switches SW 1.1, SW1.2 may be coupled to ground.

The oscillator 240 also may be coupled to the source voltage VDD. The oscillator may have a pair of outputs, each coupled to a respective energy switch SW1.1, SW1.2. The oscillator 240 also may be coupled to a drain of a feedback switch SW2. A source of the feedback switch SW2 may be coupled to ground. A gate of the feedback switch SW2 may be coupled to a feedback isolator transformer 250, which passes control signals from the second circuit loop 220 to the first circuit loop 210. In response to the control signals, the feedback switch SW2 selectively activates or deactivates the oscillator 240.

The second circuit loop 220 may include both windings 230.2.1, 230.2.1 of the secondary coil of the microtransformer 230.2, a pair of diodes 260.1, 260.2, a load circuit 270 and a comparator 280. During operation, the microtransformer 230 may induce currents in respective windings 230.2.1, 230.2.2 of the secondary loop. These currents may be delivered to the load 270 through respective diodes 260.1, 260.1. In the configuration of FIG. 2, the currents are delivered to a common node N to which the load 270 and the comparator 280 are connected. Currents are not permitted to back propagate from node N to the secondary winding 230.2 of the microtransformer due to the diodes 260.1, 260.2. The currents develop a potential across the load circuit 270. The comparator 280 may test the potential across the load 270 and develop feedback control signals if the potential exceeds or falls below operational requirements. The comparator 280 may be coupled to the feedback isolator transformer 250 to deliver the control signals back to the first circuit loop 210.

During operation, the feedback switch SW2 controls the oscillator 240 between an active state and an inactive state. In the active state, the oscillator 240 generates an oscillating driving signal to the energy switches SW1.1, SW1.2, which causes the energy switch SW1.1, SW1.2 to switch respective primary coils 230.1.1, 230.1.2 of the microtransformer 230 on and off at the frequency of the driving signal. The driving signals to the two energy switches are out of phase with respect to each other and, therefore, energy switches switch the primary coils 230.1.1, 230.1.2 on and off out of phase from each other as well. The frequency of the driving signals typically is much higher than the frequency of the feedback signal, which permits the microtransformer 230 to be switched at high frequency for power delivery to the second circuit loop 220 but permit a relatively slow feedback control signal to be returned to the first circuit loop 210 from the second circuit loop 220.

In practice, because the energy switches SW1.1, SW1.2 are power switches that control the respective primary coils 230.1.1, 230.1.2, the energy switch may be made relatively large as compared to other transistor switches (for example, the feedback switch SW2). The energy switches SW1.1, SW1.2, therefore, may possess a relatively large gate capacitance, which is modeled as respective capacitors CP1, CP2. Typically, switches with large parasitic capacitance would cause large power dissipation when they are switched at high frequencies. The embodiment of FIG. 2, however, couples the gate of the energy switches SW1.1, SW1.2 to an oscillator 240, which advantageously uses the parasitic capacitance of the energy switches SW1.1, SW1.2 during operation. When activated, the oscillator 240 operates at a resonant frequency which drives charge to the switch gates and receives return charge from the switch gate at the resonant frequency. The parasitic capacitance of the energy switches SW1.1, SW1.2 act as capacitors and accumulate charge during a first phase of oscillation, when the oscillator drives charge to the gate, but returns the charge to the oscillator in the next phase of oscillation, when the oscillator receives charge. Again, the driving signals applied to switch SW1.1 may be out of phase with respect to the driving signals applied to switch SW1.2. In the embodiment of FIG. 2, the oscillator receives charge from one switch (say, switch SW1.1) as it is driving charge to the other switch SW1.2 and vice versa. Power dissipation by the parasitic capacitance of the energy switch SW1.1, SW1.2, therefore, is minimized.

As another advantage, the design of FIG. 2 removes a feedback switch SW2 from current paths occupied by either of the primary coils 230.1.1, 230.1.2 and the energy switches SW1.1, SW1.2. This design minimizes the number of switches in each current path and, as a consequence, reduces switch-based losses in them. Further, the switching frequencies applied to the primary coils 230.1.1, 230.1.2 are no longer limited by switching frequencies of the feedback switch SW2.

As a further advantage, the design of FIG. 2 permits optimized transformer switching frequency because the transformer switching frequency no longer depends on the inductance of the windings for the power transformer 230. Although the oscillator frequency may depend on the energy switch sizes, it is less likely to be impacted by it.

Figure 3:
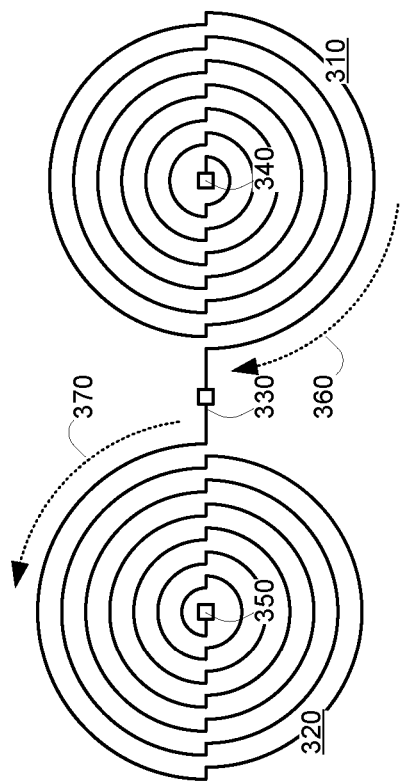
FIG. 3 illustrates microtransformer windings according to an embodiment of the present invention.

FIG. 3 illustrates a layout of a single microtransformer coil 300 with a pair of sub-coils 310, 320 according to an embodiment of the present invention. The structure of FIG. 3 may be repeated for the primary coil and the secondary coil of FIG. 2. In this embodiment, each of the sub-coils 310, 320 may be laid out on a planar substrate as conductors arranged as spiral loops. Although FIG. 3 illustrates the spirals as segmented arcs, other geometric patterns can be used for the windings, including continuous spirals and spirals based on square, rectangular or triangular shapes. The microtransformer coil 300 may include a center tap 330, which is a terminal provided for connection to other circuit elements. Each of the sub-coils 310, 320 may include other terminals 340, 350 to connect the respective sub-coil to other circuit elements. During operation, each sub-coil 310, 320 will carry current in a predetermined direction, shown by directional arrows 360, 370. According to an embodiment, the windings of each sub-coil 310, 320 may be oriented such that, when they carry current, they generate flux in opposing directions as shown in FIG. 4.

Figure 4:
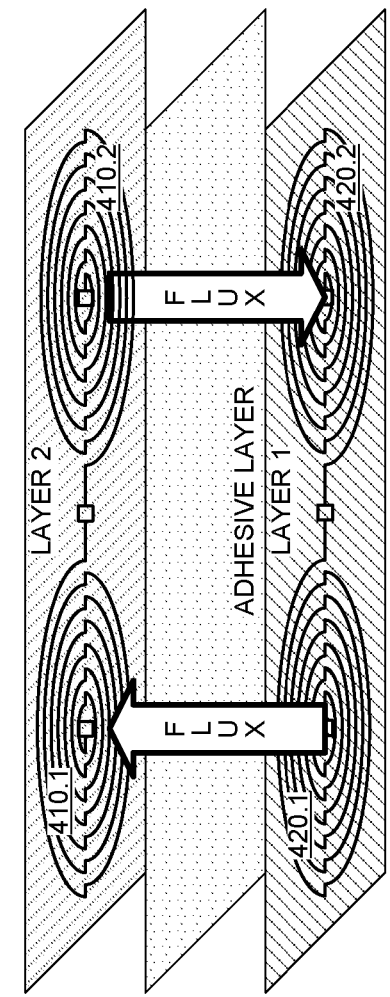
FIG. 4 illustrates a microtransformer according to an embodiment of the present invention.

FIG. 4 schematically illustrates a microtransformer constructed according to an embodiment of the present invention. In FIG. 4, a first coil 410 is provided in a first layer (layer 1); the first coil 410 may include a pair of sub-coils 410.1, 410.2. A second coil 420 may be provided in a second layer (layer 2) and also may include a second pair of sub-coils 420.1, 420.2. The first and second layers may be provided in respective integrated circuits maintained spaced apart by a separation distance. Alternatively, a first coil 410 may be provided on a substrate over which a dielectric layer (such as an adhesive layer) is formed and the second coil 420 may be provided on the dielectric layer. In both cases, the first and second coils 410, 420 are electrically isolated from each other. The sub-coils of the first and second coils may be aligned by their centers to link them by electromagnetic flux. For example, the first sub-coils 410.1, 420.1 of each of the first and second coils may be spatially aligned and the second sub-coils 410.2, 420.2 also may be spatially aligned.

FIG. 4 illustrates flux being generated between sets of sub-coils. As shown, the orientation of the sub-coil windings may be selected to cause flux generated by a first set of sub-coils 410.1/420.1 to have an orientation that is opposite to the flux generated by a second set of sub-coils 410.2/420.2. The design permits the sub-coils to generate flux that is locally intense, which causes power transfer between the coils as described above. At the same time, the opposed orientation of the two flux sources can cause cancellation of radiated flux at locations that are distant from the coils. Thus, the microtransformer design of FIG. 4 may cause reduced electromagnetic radiation at locations distant from the coils which can cause reduced interference at other circuit components.

FIG. 5 is a circuit schematic of an oscillator 500 according to an embodiment of the present invention. The oscillator may include an inductor L and a capacitor C coupled in parallel to each other via nodes N1 and N2. A first pair of oscillator switches Osc1, Osc2 are shown coupling the nodes N1 and N2 respectively to VDD. The oscillator switches Osc1, Osc2 may couple directly to VDD or, as illustrated in FIG. 5, may be coupled to VDD through the feedback switch SW2 (shown in phantom). A gate of oscillator switch Osc1 may be coupled to node N2 and a gate of oscillator switch Osc2 may be coupled to node N1. A second pair of oscillator switches Osc3, Osc4 may be provided to couple the nodes N1 and N2 respectively to ground. The oscillator switches Osc3, Osc4 may coupled directly to ground as illustrated in FIG. 5 or, alternatively, may couple to ground through the feedback switch SW2. A gate of oscillator switch Osc3 may be coupled to node N2 and a gate of oscillator switch Osc4 may be coupled to node N1. This configuration generates oscillating voltages at nodes N1, N2 according to sizes of the inductor L and capacitor C and to switching speeds of the oscillator switches Osc1-Osc4. Nodes N1 and N2 may be used as oscillator outputs and couple to the energy switch(es) of FIG. 1 or FIG. 2.

FIG. 6 is a circuit schematic of an oscillator 600 according to another embodiment of the present invention. The oscillator may include an inductor with a center tap connected to VDD and having sub-inductors L1.1 and L1.2. A pair of switches Osc5, Osc6 are provided coupling terminals of the respective sub-inductors L1.1 and L1.2 to ground. The switches may be cross coupled, having gates coupled to the output nodes N3, N4 of the counterpart inductor (e.g., the gate of Osc5 is coupled to N4 and the gate of Osc6 is coupled to N3). The oscillator 600 also may include a bridging capacitor C1, although the capacitor may be omitted depending on parasitic capacitance provided by the cross-coupled switches Osc5, Osc6. This configuration generates oscillating voltages at nodes N3, N4. Nodes N3 and N4 may be used as oscillator outputs and couple to the energy switch(es) of FIG. 1 or FIG. 2.

Several embodiments of the present invention are specifically illustrated and described herein. However, it will be appreciated that modifications and variations of the present invention are covered by the above teachings and within the purview of the appended claims without departing from the spirit and intended scope of the invention.

I claim:

1. A transformer-based power conversion system, comprising:
    a microtransformer having primary and secondary coils, the primary coil being a member of a first circuit loop and the secondary coil being a member of a second circuit loop,
    an energy switch coupled to the primary coil to selectively enable and disable a current path through the primary coil,
    an oscillator coupled to the energy switch to control activation of the energy switch, and
    a feedback switch coupled to the oscillator to selectively enable and disable the oscillator in response to a feedback control signal from the second circuit loop,
    wherein the energy switch is the only microtransformer control switch provided in a current path between a microtransformer supply voltage and ground.

2. The power conversion system of claim 1, wherein the secondary loop comprises:
   a load device coupled to a second ground potential galvanically isolated from the ground of the primary circuit loop, and
   a diode coupling the secondary coil to the load device.

3. The power conversion system of claim 1, further comprising a feedback circuit provided in the second circuit loop to test a voltage established by power conversion across the microtransformer, the feedback circuit generating a feedback control signal to the feedback switch.

4. The power conversion system of claim 3, wherein the feedback circuit comprises
   a voltage comparator and
   a feedback microtransformer having a pair of coils, respective coils provided in each of the first and second circuit loop, the coil in the first circuit loop coupled to the feedback switch.

5. The power conversion system of claim 1, wherein the energy switch and the feedback switch both are transistors, the energy switch transistor being larger than the feedback switch transistor.

6. The power conversion system of claim 1, wherein the feedback control signal operates at a frequency lower than an oscillation frequency of the oscillator.

7. The power conversion system of claim 1, wherein the first circuit loop is provided in a common substrate of an integrated circuit.

8. The power conversion system of claim 1, wherein the primary and secondary coils are provided on stacked substrate layers of an integrated circuit.

9. The power conversion system of claim 1, wherein the primary coil is coupled directly to a supply voltage of the first circuit loop.

10. A transformer-based power conversion system, comprising a pair of electrically isolated circuit loops coupled together by a power transformer,
    wherein the first circuit loop comprises:
       a first current path extending from a supply voltage to a first ground and including a primary coil of the power transformer and a single energy switch to selectively enable and disable the first current path,
       a second current path extending from the supply voltage to the first ground and including an oscillator and a feedback switch to selectively enable and disable the second current path, and
       wherein a control terminal of the energy switch is coupled to an output of the oscillator; and
    wherein the second circuit loop comprises a secondary coil of the power transformer and a load device.

11. The power conversion system of claim 10, wherein the secondary loop further comprises a diode provided within the loop formed by the secondary coil and the load device.

12. The power conversion system of claim 10, further comprising a feedback circuit provided in the second circuit loop to test a voltage established by power conversion across the power transformer, the feedback circuit generating a feedback control signal to the feedback switch.

13. The power conversion system of claim 12, wherein the feedback circuit comprises
    a voltage comparator and
    a feedback microtransformer having a pair of coils, respective coils provided in each of the first and second circuit loop, the coil in the first circuit loop coupled to the feedback switch.

14. The power conversion system of claim 10, wherein the energy switch and the feedback switch both are transistors, the energy switch transistor being larger than the feedback switch transistor.

15. The power conversion system of claim 10, wherein the feedback control signal operates at a frequency lower than an oscillation frequency of the oscillator.

16. A transformer-based power conversion system, comprising:
    a microtransformer having primary and secondary coils, the primary coil being a member of a first circuit loop and the secondary coil being a member of a second circuit loop,
    an energy switch coupled to the primary coil to selectively enable and disable a current path through the primary coil,
    an oscillator coupled to the energy switch to control activation of the energy switch, and
    a feedback switch coupled to the oscillator to selectively enable and disable the oscillator in response to a feedback control signal from the second circuit loop,
    wherein the primary coil is coupled directly to a supply voltage of the first circuit loop.

17. A transformer-based power conversion system, comprising:
    a microtransformer having primary and secondary coils, each of the primary and secondary coils having center taps dividing the respective coils into a pair of sub-coils, the primary coil being a member of a first circuit loop and the secondary coil being a member of a second circuit loop,
    wherein the first circuit loop comprises:
       a first and second current paths each extending from a supply voltage to a first ground and including a respective sub-coil of the primary coil and a single energy switch to selectively to enable and disable the respective current path,
       a third current path extending from the supply voltage to the first ground and including an oscillator and a feedback switch to selectively enable and disable the third current path, the oscillator having a pair of outputs, one coupled to each of the energy switches; and
    wherein the second circuit loop comprises a secondary coil of the power transformer and a load device.

18. The power conversion system of claim 17, wherein sub-coils of the primary coil include a plurality of spiral windings oriented to generate flux in mutually opposing directions when the sub-coils carry current.

19. The power conversion system of claim 17, wherein the secondary loop comprises:
    a load device coupled to a second ground potential galvanically isolated from the ground of the primary circuit loop, and
    a diode coupling the secondary coil to the load device.

20. The power conversion system of claim 17, further comprising a feedback circuit provided in the second circuit loop to test a voltage established by power conversion across the microtransformer, the feedback circuit generating a feedback control signal to the feedback switch.

21. The power conversion system of claim 3, wherein the feedback circuit comprises
    a voltage comparator and
    a feedback microtransformer having a pair of coils, respective coils provided in each of the first and second circuit loop, the coil in the first circuit loop coupled to the feedback switch.

22. The power conversion system of claim 17, wherein the energy switch and the feedback switch both are transistors, the energy switch transistor being larger than the feedback switch transistor.

23. The power conversion system of claim 17, wherein the feedback control signal operates at a frequency lower than an oscillation frequency of the oscillator.

24. The power conversion system of claim 17, wherein the first circuit loop is provided in a common substrate of an integrated circuit.

25. The power conversion system of claim 17, wherein the primary and secondary coils are provided on stacked substrate layers of an integrated circuit.

26. The power conversion system of claim 17, wherein the primary coil is coupled directly to a supply voltage of the first circuit loop.

27. A microtransformer system comprising:
primary and secondary coils, each having center taps that divide the respective coils into respective first and second sub-coils, wherein:
first and second sub-coils of the primary coil are provided in a stacked relationship with respect to corresponding first and second sub-coils of the secondary coil, and
coil windingsh of the first primary and secondary sub-coils are oriented to generate flux in a first direction when one of the first primary and secondary sub-coils carry current and
coil windings of the second primary and secondary sub-coils are oriented to generate flux in a second direction, opposite to the first direction, when one of the second primary and secondary sub-coils carry current.

* * * * *

UNITED STATES PATENT AND TRADEMARK OFFICE
CERTIFICATE OF CORRECTION

PATENT NO. : 7,983,059 B2
APPLICATION NO. : 12/202627
DATED : July 19, 2011
INVENTOR(S) : Baoxing Chen It is certified that error appears in the above-identified patent and that said Letters Patent is hereby corrected as shown below:

In the Specifications

In column 8, line 37, change "to selectively to enable" to -- to selectively enable --

In column 10, line 8, change "windingsh" to -- windings --

Signed and Sealed this
Twenty-first Day of May, 2013

Teresa Stanek Rea
*Acting Director of the United States Patent and Trademark Office*